(12) United States Patent
Kreb et al.

(10) Patent No.: US 11,038,468 B2
(45) Date of Patent: Jun. 15, 2021

(54) CIRCUIT ARRANGEMENT FOR GENERATING A SUPPLY VOLTAGE WITH CONTROLLABLE GROUND POTENTIAL LEVEL

(71) Applicant: Siemens Aktiengesellschaft, Munich (DE)

(72) Inventors: Walter Kreb, Schwanheim (DE); Ulrich Lehmann, Wörth (DE); Wilhelm Griesbaum, Landau (DE)

(73) Assignee: Siemens Aktiengesellschaft, Munich (DE)

( * ) Notice: Subject to any disclaimer, the term of this patent is extended or adjusted under 35 U.S.C. 154(b) by 77 days.

(21) Appl. No.: 16/411,355

(22) Filed: May 14, 2019

(65) Prior Publication Data

US 2019/0356273 A1 Nov. 21, 2019

(30) Foreign Application Priority Data

May 15, 2018 (EP) .................................. 18172430

(51) Int. Cl.
*H03F 3/45* (2006.01)
*H03F 1/02* (2006.01)
*G01R 15/14* (2006.01)

(52) U.S. Cl.
CPC .......... *H03F 1/0222* (2013.01); *G01R 15/14* (2013.01); *H03F 3/45071* (2013.01)

(58) Field of Classification Search
CPC .. H03F 1/0222; H03F 1/0227; H03F 3/45071; H03F 3/45085; H03F 1/3211; H03F 3/45475; H03F 3/45183; H03F 3/45479; G01R 15/14

USPC .................................................. 330/252, 259
See application file for complete search history.

(56) References Cited

U.S. PATENT DOCUMENTS

| 4,704,575 A | 11/1987 | Arnoux et al. | |
|---|---|---|---|
| 7,135,922 B2 * | 11/2006 | Zepp | H03F 1/30 330/251 |
| 7,800,439 B2 * | 9/2010 | Riedel | H03F 3/08 330/59 |

(Continued)

FOREIGN PATENT DOCUMENTS

JP 2004214712 7/2004

OTHER PUBLICATIONS

Williams Jim: "Composite Amplifiers Yield High Speed and Low Offset", EDN Electrical Design News.(Texas Instrument), Reed Business Information, Highlands Ranch, eo. US, vol. 32, No. 2, pp. 139-150, XP002163314, ISSN: 0012-7515, Figure 9; 1987.

(Continued)

*Primary Examiner* — Khanh V Nguyen
(74) *Attorney, Agent, or Firm* — Cozen O'Connor

(57) ABSTRACT

A circuit arrangement for generating a supply voltage with a controllable ground potential level includes a voltage source that provides the supply voltage ungrounded, a control unit that generates an adjustable control d.c. voltage to ground, and an operational amplifier that is connected via its voltage supply terminals to the supply voltage source, where the control d.c. voltage is applied to the inverting input of the operational amplifier, the non-inverting input of the operational amplifier is connected via a resistor network to the voltage source and to a ground terminal and the output of the operational amplifier is fed back to the inverting input via a capacitor.

7 Claims, 1 Drawing Sheet

(56) References Cited

U.S. PATENT DOCUMENTS 8,243,956 B2* 8/2012 Turnbull ................. H04R 3/00
                                                                                                       381/95
2012/0062320 A1* 3/2012 Fan ........................ H03F 1/305
                                                                                                       330/269

OTHER PUBLICATIONS

Office Action dated Apr. 26, 2021 issued in European Patent Application No. 18172430.3.

* cited by examiner

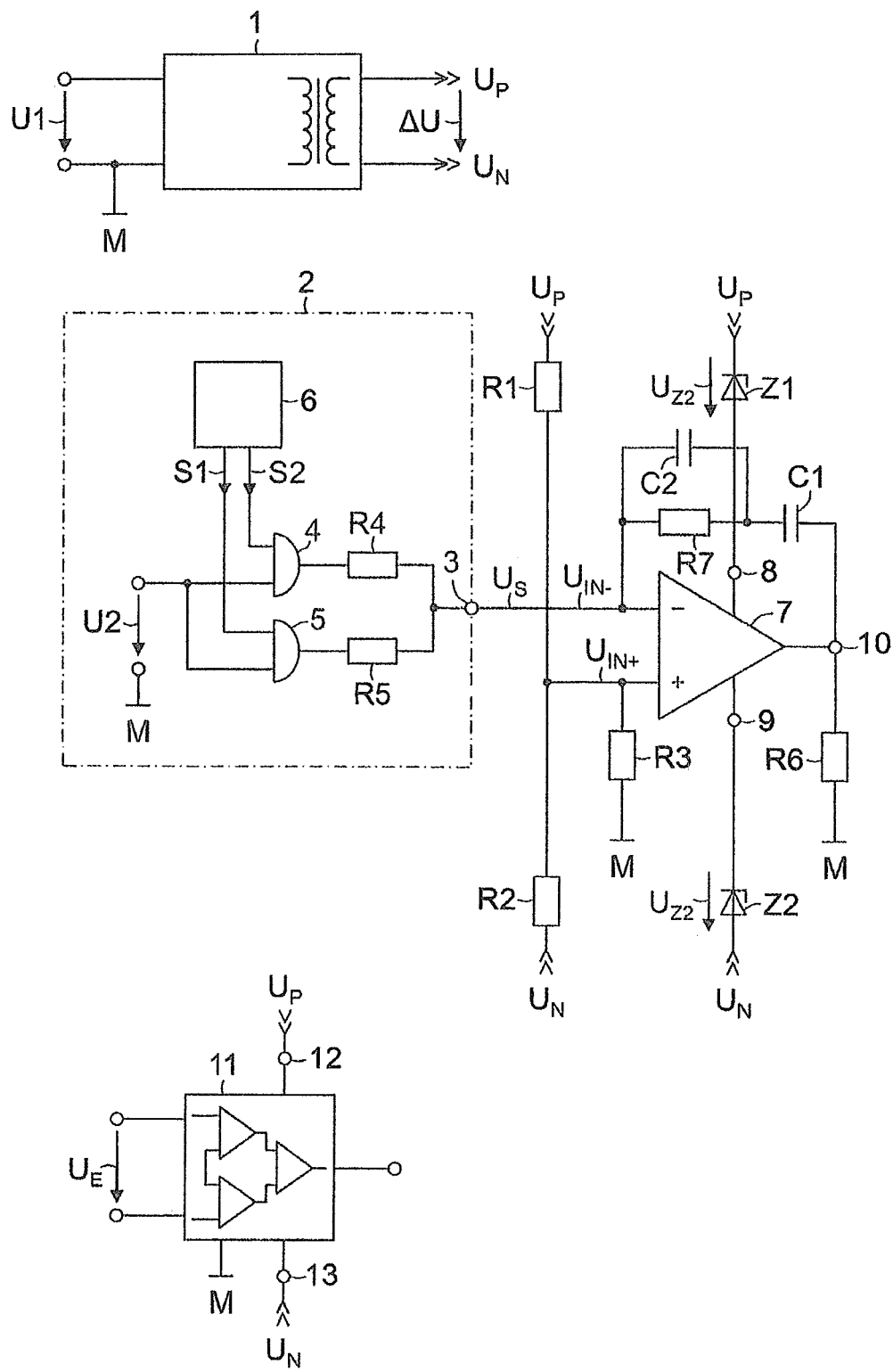

CIRCUIT ARRANGEMENT FOR GENERATING A SUPPLY VOLTAGE WITH CONTROLLABLE GROUND POTENTIAL LEVEL

BACKGROUND OF THE INVENTION

1. Field of the Invention

The invention relates to a circuit arrangement for generating a supply voltage with a controllable ground potential level.

2. Description of the Related Art

Measuring amplifiers, e.g., instrument amplifiers, with a differential input (differential amplifiers) have a restricted common-mode input voltage range. This also depends on the level of the supply voltage of the input stages, which are often implemented using operational amplifiers. Generally, the input voltages at the operational amplifier inputs cannot be higher than the supply voltage of the operational amplifier. For measurement ranges with both a high positive and a high negative common-mode input voltage, this requires operational amplifier stages with a high bipolar voltage supply. Operational amplifiers with maximum supply voltages above ±20 V are however expensive, often do not have the desired properties in respect of noise and offset voltage and bring about a correspondingly high power loss because of the high supply voltages.

Hitherto, as mentioned, use has been made of a high positive and negative supply voltage of the operational amplifiers or the input voltages are reduced using voltage dividers. Likewise, it is known to switch between different supply voltages or to provide electrically isolated solutions, which however is associated with high complexity in the case of multichannel systems.

JP 2004 214712 A, in particular FIG. 11 thereof, discloses an anti-pop circuit for an amplifier with muting. The amplifier contains an operational amplifier with a feedback resistor determining the amplification A and with a feedback capacitor in an inverting amplifier circuit. The operational amplifier is connected by its voltage supply terminals to a voltage source between a supply voltage potential VDD2 and ground and at its inverting input receives an input signal ei to be amplified, which can vary between a maximum voltage value VDD1 and zero (ground) around the average value ½·VDD1. The non-inverting input of the operational amplifier is connected, via a switchable resistor network to the supply voltage potential VDD2 of the voltage source, to a reference voltage potential with the value VDD1 and to the ground terminal. With the help of the switchable resistor network, the voltage level at the output of the operational amplifier is adjusted as a function of the amplification factor A such that its output voltage in amplifier mode has the average value ½·VDD2 and retains this value in the case of muting (A=0). If the reference voltage VDD1 has a residual ripple ΔVDD1, this can be compensated for by a hum voltage ½·ΔVDD1 which is superimposed on the input signal ei and which is generated with the help of a 1-bit D/A converter (PRZ).

There is no question in JP 2004 214712 A of generating a supply voltage with a controllable ground potential level.

SUMMARY OF THE INVENTION

In view of the foregoing, it is therefore an object of the invention to provide a circuit arrangement based on a supply voltage, for example, and in particular for differential amplifiers, with an adjustable ground potential level.

This and other objects and advantages are achieved in accordance with the invention, by a circuit arrangement for generating a supply voltage with a controllable ground potential level having a voltage source which provides the supply voltage ungrounded as a difference between two supply voltage potentials, i.e., electrically isolated from ground, a control unit which generates an adjustable control d.c. voltage to ground, and an operational amplifier, which is connected by its voltage supply terminals to the supply voltage potentials of the voltage source, where the control d.c. voltage is applied to the inverting input of the operational amplifier, the non-inverting input of which is connected via a resistor network to the supply voltage potentials of the voltage source and to a ground terminal and the output of which is fed back to the inverting input via a capacitor.

The invention is based on the use of an electrically isolated supply voltage for the operational amplifier, where the potential of this supply voltage against ground is actively controlled via the control d.c. voltage and via the feedback from the operational amplifier. The input common-mode range of a differential amplifier connected on the supply side to the voltage source and ground can then move within a range, the upper and lower limit of which corresponds, at least theoretically, to the positive or negative amount of the supply voltage.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWING

To further explain the invention, reference is made below to the single FIG. in the drawing, in which:

The FIG. shows an exemplary simplified schematic representation of an embodiment the inventive circuit arrangement.

DETAILED DESCRIPTION OF THE EXEMPLARY EMBODIMENTS

The FIG. shows a voltage source 1, for example, in the form of a d.c. voltage converter with electrical isolation of input and output side, which generates an output voltage from an input voltage U1 and makes this available as a supply voltage ΔU electrically isolated from the ground M. The supply voltage potentials $U_P$ and $U_N$ ($\Delta U = U_P - U_N$) are therefore initially undefined.

Therefore, a controllable adjustment of the ground potential level of the supply voltage (ΔU) or of the supply voltage potentials $U_P$ and $U_N$ against ground M should occur as a function of a control d.c. voltage $U_S$ (to ground M). The control d.c. voltage $U_S$ can be generated in a variety of ways by a control unit 2 at its control output 3. In the illustrated example, the control d.c. voltage $U_S$ is generated as an average value of two individually activatable and deactivatable, here identical, fixed voltages, in that a logic voltage U2, e.g., a TTL or LVTTL supply voltage, is connected to the control output 3 with the help of two AND gates 4, 5 as a function of two logic control signals S1, S2 and via resistors R4 and R5. The control signals S1, S2 are generated by a computer apparatus 6, e.g. a CPU, such that where R4=R5 three different values of the control d.c. voltage $U_S$ can be generated:

TABLE 1

| S1 | S2 | $U_S$ |
|---|---|---|
| 0 | 0 | 0 |
| 1 | 0 | ½ U2 |
| 1 | 1 | U2 |

In a particularly easy to implement alternative, the logic levels U2 and 0 V can, for example, be output directly to the resistors R4 and R5 via a slide register.

The control d.c. voltage $U_S$ lies directly at the inverting input (−) of an operational amplifier 7, which by its voltage supply terminals 8, 9 is connected either directly or, as shown here, to reduce the power loss at the operational amplifier 7, via Zener diodes Z1, Z2 to the voltage source 1, such that the supply voltage potential $U_P$ reduced by the Zener voltage $U_{Z1}$ is applied to the voltage supply terminal 8 and the supply voltage potential $U_N$ reduced by the Zener voltage $U_{Z2}$ is applied to the voltage supply terminal 9.

The non-inverting input (+) of the operational amplifier 7 is connected via a resistor network R1, R2, R3 to the voltage source 1 and to ground M. In the simplest case shown here, the non-inverting input (+) is connected via the resistor R1 to the supply voltage potential $U_P$, via the resistor R2 to the supply voltage potential $U_N$ and via the resistor R3 to ground M. The output 10 of the operational amplifier 7 is fed back via a capacitor C1 and optionally a resistor R7 with (if necessary) a parallel capacitor C2 to the inverting input (−). The operational amplifier 7 thus operates as an I controller or PI controller without a permanent control deviation; i.e., no direct current affecting the control d.c. voltage $U_S$ flows from the output 10 of the operational amplifier 7 through the resistors R4 and R5. Finally, the output 10 of the operational amplifier 7 can be connected to ground, e.g. in a low-resistance manner, via a resistor R6.

The following applies for the voltage $U_{IN+}$ between the non-inverting input (+) of the operational amplifier 7 and ground M:

$$U_{IN+} = U_P \cdot \frac{R2\|R3}{R1 + R2\|R3} + U_N \cdot \frac{R1\|R3}{R2 + R1\|R3} =$$

$$U_P \cdot \frac{R2 \cdot R3}{R1 \cdot R2 + R1 \cdot R3 + R2 \cdot R3} + U_N \cdot \frac{R1 \cdot R3}{R1 \cdot R2 + R1 \cdot R3 + R2 \cdot R3}.$$

$U_P$ and $U_N$ are the supply voltage potentials to be adjusted to ground M. Furthermore, because of the I or PI feedback from the operational amplifier 7 the following applies for the voltage $U_{IN-}$ between the inverting input (+) of the operational amplifier 7 and ground M: $U_{IN-}=U_{IN+}=U_S$. Using $\Delta U=U_P-U_N$, the following is therefore obtained:

$$U_P = U_S \cdot \left(1 + \frac{R1 \cdot R2}{R1 \cdot R3 + R2 \cdot R3}\right) + \Delta U \cdot \frac{R1}{R1 + R2} \text{ and}$$

-continued $$U_N = U_S \cdot \left(1 + \frac{R1 \cdot R2}{R1 \cdot R3 + R2 \cdot R3}\right) - \Delta U \cdot \frac{R2}{R1 + R2}.$$

By way of example, let $\Delta U=30$ V and U2=3.3 V. Where R4=R5, R1=200 kΩ, R2=1 MΩ and R3=33 kΩ, the following supply voltage potentials $U_P$ and $U_N$ can be adjusted to ground M as a function of the control signals S1, S2:

TABLE 2

| S1 | S2 | $U_S$ | $U_P$ | $U_N$ |
|---|---|---|---|---|
| 0 | 0 | 0 | 5 V | −25 V |
| 1 | 0 | 1.65 V | 15 V | −15 V |
| 1 | 1 | 3.3 V | 25 V | −5 V |

In the example shown, the highest absolute value for $U_P$ and $U_N$ is 25 V in each case. As a result, the Zener diodes Z1, Z2 used to reduce the power loss at the operational amplifier 7 can typically have Zener voltages of 4.3 V. Unwanted deviations in the ground potential level caused, for example, by external interference, such as bursts, are restricted by the reduced output voltage range of the operational amplifier 7. The resistor R6 at the output 10 of the operational amplifier 7 can also contribute to this restriction.

In the exemplary illustrated embodiment, a differential amplifier 11, e.g., an instrument amplifier, is connected by its voltage supply terminals 12, 13 to the voltage source 1 and is further connected to the ground terminal M. The common-mode range, theoretically $\Delta U$, of the input voltage $U_E$ of the differential amplifier 11 can be shifted between $+|\Delta U|$ and $-|\Delta U|$ via the control d.c. voltage $U_S$.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A circuit arrangement for generating a supply voltage with a controllable ground potential level, the circuit arrangement comprising:
    a voltage source which provides the supply voltage ungrounded as a difference between two supply voltage potentials;
    a control unit which generates an adjustable control d.c. voltage to ground; and
    an operational amplifier having voltage supply terminals connected to the supply voltage potentials of the voltage source, the adjustable control d.c. voltage being applied to an inverting input of the operational amplifier, a non-inverting inverting input of the operational amplifier being connected via a resistor network to the supply voltage potentials of the voltage source and to a ground terminal and an output of the operational amplifier being fed back to the inverting input via a capacitor.

2. The circuit arrangement as claimed in claim 1, wherein the control unit is configured to generate the adjustable control d.c. voltage as an average value of at least two individually activatable and deactivatable fixed voltages.

3. The circuit arrangement as claimed in claim 1, further comprising:
   a resistor connected in series with the capacitor between the output of the operational amplifier and the inverting input of the operational amplifier.

4. The circuit arrangement as claimed in claim 1, further comprising:
   a resistor connected in series with the capacitor between the output of the operational amplifier and the inverting input of the operational amplifier.

5. The circuit arrangement as claimed in claim 1, wherein the supply terminals of the operational amplifier are connected to the supply voltage potentials of the voltage source via Zener diodes.

6. The circuit arrangement as claimed in claim 1, wherein the voltage source is configured as a d.c. to d.c. converter with electrical isolation of input and output sides.

7. The circuit arrangement as claimed in claim 1, further comprising:
   a differential amplifier having voltage supply terminals, the differential amplifier being connected via the voltage supply terminals to the supply voltage potentials of the voltage source and being further connected to the ground terminal.

* * * * *